(12) United States Patent
Park

(10) Patent No.: US 10,783,828 B2
(45) Date of Patent: Sep. 22, 2020

(54) ORGANIC LIGHT EMITTING DIODE (OLED) DISPLAY DEVICE

(71) Applicant: LG DISPLAY CO., LTD., Seoul (KR)

(72) Inventor: Jaehoon Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 9 days.

(21) Appl. No.: 16/226,532

(22) Filed: Dec. 19, 2018

(65) Prior Publication Data

US 2019/0206328 A1 Jul. 4, 2019

(30) Foreign Application Priority Data

Dec. 29, 2017 (KR) .......................... 10-2017-0184048

(51) Int. Cl.
*G09G 3/3258* (2016.01)
*G09G 3/3291* (2016.01)
*G09G 3/3266* (2016.01)
*H01L 27/32* (2006.01)

(52) U.S. Cl.
CPC ......... *G09G 3/3258* (2013.01); *G09G 3/3266* (2013.01); *G09G 3/3291* (2013.01); *H01L 27/3262* (2013.01); *H01L 27/3265* (2013.01); *G09G 2300/043* (2013.01); *G09G 2300/0426* (2013.01); *G09G 2300/0439* (2013.01); *G09G 2310/08* (2013.01); *G09G 2320/0233* (2013.01); *G09G 2320/0257* (2013.01)

(58) Field of Classification Search
CPC .. G09G 3/3258; G09G 3/3291; G09G 3/3266; G09G 2320/0257; G09G 2300/0439; G09G 2310/08; G09G 2300/043; G09G 2320/0233; G09G 2300/0426; G09G 2320/045; G09G 2300/0852; G09G 2300/0819; G09G 3/3233; G09G 3/3208; H01L 27/3262; H01L 27/3265
See application file for complete search history.

(56) References Cited

U.S. PATENT DOCUMENTS

2013/0249413 A1* 9/2013 Chen .................... G09G 3/3258
315/172
2016/0240565 A1* 8/2016 Kim .................. H01L 29/78606

* cited by examiner

*Primary Examiner* — Andrew Sasinowski
(74) *Attorney, Agent, or Firm* — Polsinelli PC

(57) ABSTRACT

An organic light emitting diode (OLED) display device includes a display panel including a plurality of OLED pixels arranged in a matrix form to display an image, and the plurality of OLED pixels each includes a switching thin film transistor (TFT) to switch a data voltage pass supplied from a data line in response to a scan signal input through a gate line, a driving TFT turned on in accordance with a magnitude of a data voltage supplied from the switching TFT to control an amount of light emitted from an OLED, and a variable storage capacitor connected in parallel to a gate electrode of the driving TFT and having a capacitance varying in accordance with a magnitude of a voltage applied to the gate electrode of the driving TFT may increase a charging speed and a charging rate of a data voltage of the OLED pixel. As a result, it is possible to improve threshold voltage compensation efficiency and solve a problem such as non-uniform luminance and an afterimage.

17 Claims, 5 Drawing Sheets

ORGANIZATIONAL LIGHT EMITTING DIODE (OLED) DISPLAY DEVICE

CROSS-REFERENCE TO RELATED APPLICATION

This application claims priority under 35 U.S.C. § 119 to Korean Application No. 10-2017-0184048, filed on Dec. 29, 2017, which is incorporated herein by reference in its entirety.

BACKGROUND

Field of the Disclosure

The present disclosure relates an organic light emitting diode (OLED) display device.

Description of the Background

Recently, the development of various flat panel displays (FPD) has been accelerated. In particular, an organic light emitting diode (OLED) display device has a fast response speed, high light emission efficiency and luminance, and a wide viewing angle by using a self-emitting device that emits light by itself.

The OLED display device arranges pixels each including an OLED in a matrix form and controls brightness of the pixels in accordance with a gray scale value of image data. The OLED display device selectively turns on a thin film transistor (TFT), which is an active device, to select a pixel, and maintains light emission of the pixel with a voltage stored in a storage capacitor.

Such an OLED display device compensates for a threshold voltage variation of a driving TFT through a voltage compensation driving method. In the OLED display device for voltage compensation, a storage capacitor is formed in a gate of the driving TFT, and the driving TFT is diode-disconnected to store a threshold voltage thereof in the storage capacitor. For example, after a sampling TFT is formed between a gate and a drain of the driving TFT for diode-connection of the driving TFT, the sampling TFT is turned on to perform voltage compensation.

In a voltage compensation driving type OLED display device, a threshold voltage compensation error rate largely depends on a parasitic capacitance between gate and source terminals of the driving TFT, and a parasitic capacitance or a storage capacitance between the gate and drain terminals of the driving TFT.

When the storage capacitance is large, a charging rate of the storage capacitor is slowed down. Hence, the shorter sampling time due to high-speed driving, the lower the charging rate. When a sampling charging rate is lowered as described above, the threshold voltage compensation error rate of the driving TFT is also lowered. As a result, a problem such as non-uniform luminance or an afterimage still remains severe.

SUMMARY

Aspects of the present disclosures provide an organic light emitting diode (OLED) display device which may improve threshold voltage compensation efficiency and solve a problem such as non-uniform luminance or an afterimage by increasing a charging speed and a charging rate of a data voltage of an OLED pixel.

Further, aspects of the present disclosure provide an OLED display device advantageous for high-speed driving by allowing a storage capacitor having a capacitance varying in accordance with a magnitude of a data voltage to be formed in a gate electrode of a driving thin film transistor (TFT) in order to increase a sampling speed and a charging rate of the data voltage of the OLED pixel.

The OLED display device according to aspects of the present disclosure may include a display panel including a plurality of OLED pixels arranged in a matrix form to display an image, and the plurality of OLED pixels each include a switching TFT to switch a data voltage pass supplied from a data line in response to a scan signal input through a gate line, a driving TFT turned on in accordance with a magnitude of a data voltage supplied from the switching TFT to control an amount of light emitted from the OLED and a variable storage capacitor connected in parallel to a gate electrode of the driving TFT and having a capacitance varying in accordance with a magnitude of a voltage applied to the gate electrode of the driving TFT.

Further, the OLED display device according to aspects of the present disclosure may include a display panel including a plurality of OLED pixels arranged in a matrix form to display an image, and the plurality of OLED pixels each include a switching TFT to switch a data voltage pass supplied from a data line in response to a scan signal input through a gate line, a driving TFT turned on in accordance with a magnitude of a data voltage supplied from the switching TFT to control an amount of light emitted from the OLED, a variable storage capacitor connected in parallel to a gate electrode of the driving TFT and having a capacitance varying in accordance with a magnitude of a voltage applied to the gate electrode of the driving TFT, and a fixed capacitor having a smaller fixed capacitance than the variable storage capacitor and connected in parallel to the variable storage capacitor.

The OLED display device according to aspects of the present disclosure having various technical features as described above may improve the threshold voltage compensation efficiency and solve the problem such as non-uniform luminance and an afterimage by increasing the charging speed and the charging rate of the data voltage of the OLED pixel.

Further, the OLED display device according to aspects of the present disclosure may be advantageous for high-speed driving by allowing the storage capacitor having a capacitance varying in accordance with a magnitude of the data voltage to be formed in the gate electrode terminal of the driving TFT in order to increase the sampling speed and the charging rate of the data voltage of the OLED pixel.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
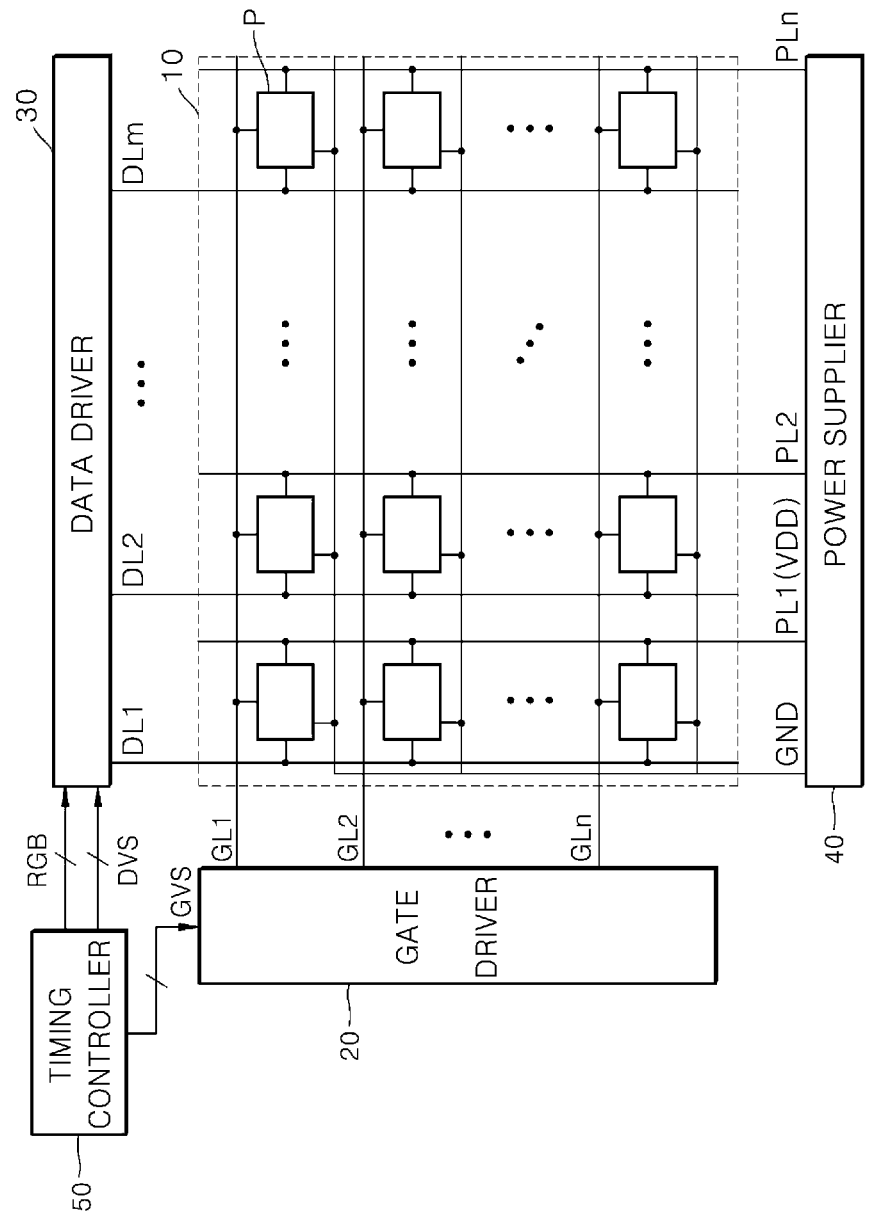
FIG. 1 shows an organic light emitting diode (OLED) display device according to an aspect of the present disclosure.

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Further, the aspects disclosed in the present specification and the configurations illustrated in the drawings are merely aspects of the present disclosure, and not all of them represent the technical aspects of the present disclosure, and thus it should be understood that there may be various equivalents and modified examples that could substitute them at the time of filing the present application.

Hereinafter, an organic light emitting diode (OLED) display device according to aspects of the present disclosure will be described in detail with reference to the accompanying drawings.

Figure 2:
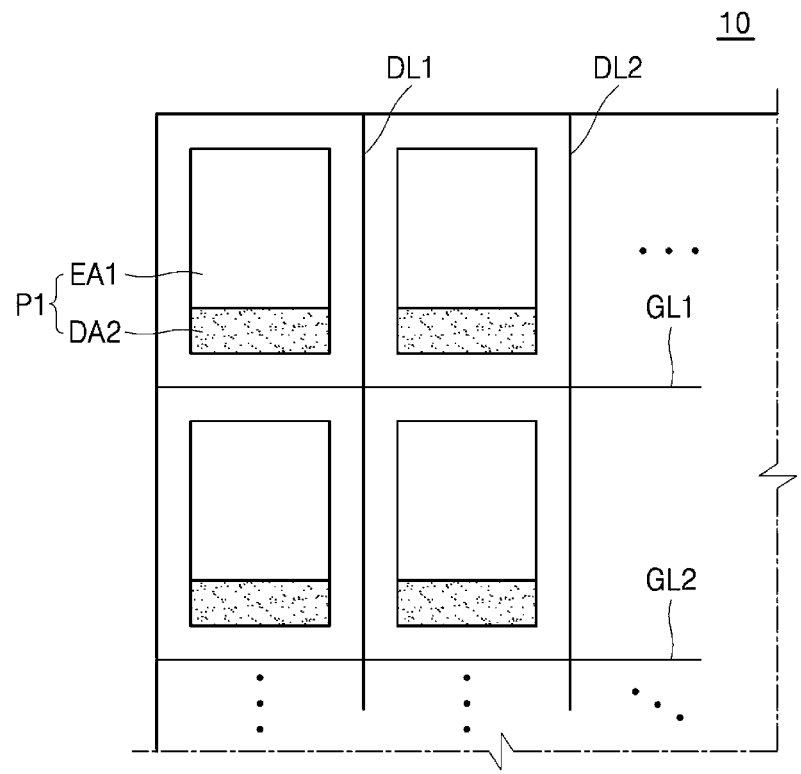
FIG. 2 shows an arrangement of some OLED pixels of the display panel shown in FIG. 1.

FIG. 1 shows an organic light emitting diode (OLED) display device according to an aspect of the present disclosure. FIG. 2 shows an arrangement of some OLED pixels of the display panel shown in FIG. 1.

Referring to FIGS. 1 and 2, the OLED display device may include a display panel 10 including m×n OLED pixels P (where each of m and n is a positive integer) arranged in a matrix form, a data driver 13 to supply a data voltage to data lines D1 to Dm, a gate driver 20 to sequentially supply scan signals to gate lines GL1 to GLn, a timing controller 50 to control driving timings of the gate and data drivers 20 and 30 by transmitting gate and data control signals GVS and DVS to the gate and data drivers 20 and 30, and a power supplier 40 to supply a ground voltage GND or a low potential voltage VSS and a high potential voltage VDD to power supply lines PL1 to PLn of the OLED pixels P.

The display panel 10 may include a plurality of OLED pixels P respectively formed in pixel areas defined by intersections of the data lines D1 to Dm and the gate lines GL1 to GLn to display an image. Each of OLED pixels P may include an OLED and a diode driving circuit to independently drive each OLED.

The high potential VDD, low potential or ground voltage GND, and a reference voltage may be commonly supplied to the OLED pixels P. The diode driving circuits may supply a diode driving voltage corresponding to an analog data voltage supplied from the data line DL connected to the diode driving circuits to the OLED and allow a data voltage to be charged in a storage capacitor so as to maintain a light emission state. Thus, the OLED pixels P may emit light in a predetermined color among red light, green light, blue light and white light.

As shown in FIG. 2, each of the OLED pixels P1 may be divided into a light emitting area EA1 and a device area DA1. The light emitting area EA1 may be an area including the OLED to emit light, and the device area DA1 is an area including devices (TFT, capacitors, and the like) to control light emission of the OLED. When the OLED display device displays an image in a bottom emission manner, the light emitting area EA1 and the device area DA1 may not overlap each other. But, when the OLED display device displays the image in a top emission manner, the light emitting area EA1 and the device area DA1 may overlap each other.

The data driver 30 may convert image data RGB supplied from the timing controller 50 into analog data voltages by means of a data control signal DVS supplied from the timing controller 50, and supply the data voltages to the respective data lines DL1 to DLm by a horizontal line unit.

Specifically, the data driver 30 may sequentially latch the image data RGB input in accordance with the data control signal DVS, and then convert the image data RGB into analog data voltages. And, the data driver 30 may supply data voltages for one horizontal line to the respective data lines DL1 to DLm every one horizontal period in which a scan signal is supplied to the respective gate lines GL1 to GLn.

The gate driver 20 may sequentially generate scan signals in response to a gate control signal GVS supplied from the timing controller 50, control a pulse width of each of the scan signals in accordance with the horizontal period, and sequentially supply the scan signals to the gate lines GL1 to GLn every one horizontal period.

Also, when the OLED pixels P each include an emission TFT to control an emission period of the OLED, the gate driver 20 may sequentially supply an emission control signal to emission lines (not shown) to drive the emission TFTs of the OLED pixels P.

Figure 3:
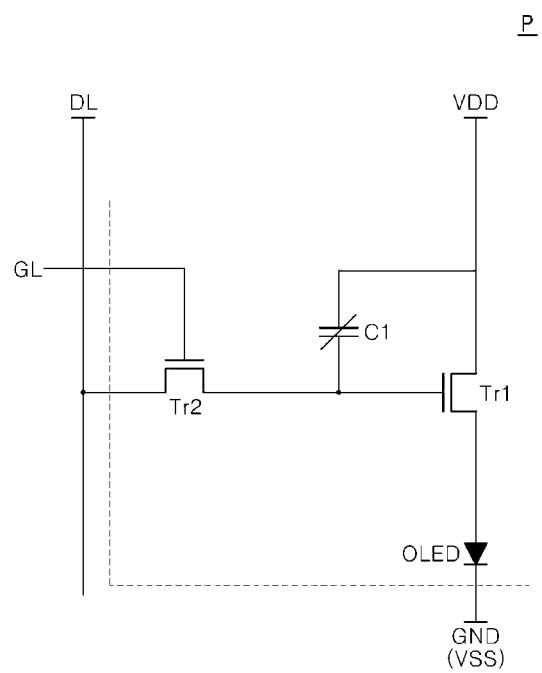
FIG. 3 is a circuit diagram briefly showing the OLED pixel shown in FIGS. 1 and 2.

FIG. 3 is a circuit diagram briefly showing the OLED pixel shown in FIGS. 1 and 2.

Referring to FIG. 3, each of the OLED pixels P according to aspects of the present disclosure may include an OLED, a driving TFT Tr1, a switching TFT Tr2 and a variable storage capacitor C1.

The switching TFT Tr2 may switch a data voltage pass supplied from the data line DL in response to a scan signal input through the gate line GL. Specifically, the switching TFT Tr2 may be turned on by a scan signal input to a gate electrode through the gate line GL to pass a data voltage input to a source electrode through the data line DL to a drain electrode, thereby allowing the data voltage to be transmitted to a node to which the gate electrode of the driving TFT Tr1 is connected.

The driving TFT Tr1 may be turned on so as to correspond to a magnitude of the data voltage input to the gate electrode through the switching TFT Tr2 and pass a current supplied from a high potential voltage source VDD to the OLED. Therefore, an amount of light emitted from the OLED may be adjusted in accordance with an amount of a current input through the driving TFT Tr1.

The variable storage capacitor C1 may be electrically connected to a gate terminal of the driving TFT Tr1 to maintain a voltage applied to the gate electrode of the driving TFT Tr1 during a turn-on period of the driving TFT Tr1.

The variable storage capacitor C1 may be formed between the gate terminal of the driving TFT Tr1 and the high or low potential voltage supply terminal VDD and in parallel with the driving TFT Tr1. The variable storage capacitor C1 formed between the gate terminal of the driving TFT Tr1 and the high or low potential voltage supply terminal VDD as described above may have a capacitance varying in accordance with a voltage difference between the gate terminal of the driving TFT Tr1 and the high or low potential voltage supply terminal VDD.

Hereinafter, only the case where the variable storage capacitor C1 is formed between the gate terminal of the driving TFT Tr1 and the high potential voltage supply terminal will be described as an example. Alternatively, the variable storage capacitor C1 may be formed between the gate terminal of the driving TFT Tr1 and a capacitor voltage input circuit, or between the gate terminal of the driving TFT Tr1 and a reference voltage input terminal.

The variable storage capacitor C1 may include a semiconductor layer, a gate insulating film, and a conductive electrode layer sequentially stacked on a substrate, and thus the capacitance of the variable storage capacitor C1 may vary in accordance with a voltage difference between the semiconductor layer and the conductive electrode layer. The conductive electrode layer of the variable storage capacitor C1 may be electrically connected to the gate terminal of the driving TFT Tr1, and thus the capacitance of the variable storage capacitor C1 may vary in accordance with a voltage difference between the gate terminal of the driving TFT Tr1 and the high potential voltage supply terminal VDD.

The capacitance of the variable storage capacitor C1 may gradually increase during a period in which a data voltage is input and sampled through the switching TFT Tr2, and input to the gate terminal of the driving TFT Tr1, and may gradually decrease during a period in which the driving TFT Tr1 is turned on and the OLED maintains light emission and a light emission state.

Auxiliary capacitors in addition to the variable storage capacitor C1 may be further formed in the gate terminal of the driving TFT Tr1. For example, a parasitic capacitor may be formed between the gate terminal of the driving TFT Tr1 and an input terminal of the OLED, and an additional parasitic capacitor may be further formed between the gate terminal of the driving TFT Tr1 and a drain terminal to which the high potential voltage VDD is input.

The variable storage capacitor C1 may include the semiconductor layer, the gate insulating film, and the conductive electrode layer sequentially stacked on the substrate. The variable storage capacitor C1 may be formed in parallel with the driving TFT Tr1 and between the gate terminal of the driving TFT Tr1 and the high potential voltage supply terminal VDD. The conductive electrode layer of the variable storage capacitor C1 may be electrically connected to the gate terminal of the driving TFT Tr1 and the semiconductor layer of the variable storage capacitor C1 may be electrically connected to the high potential voltage supply terminal VDD.

Figure 4:
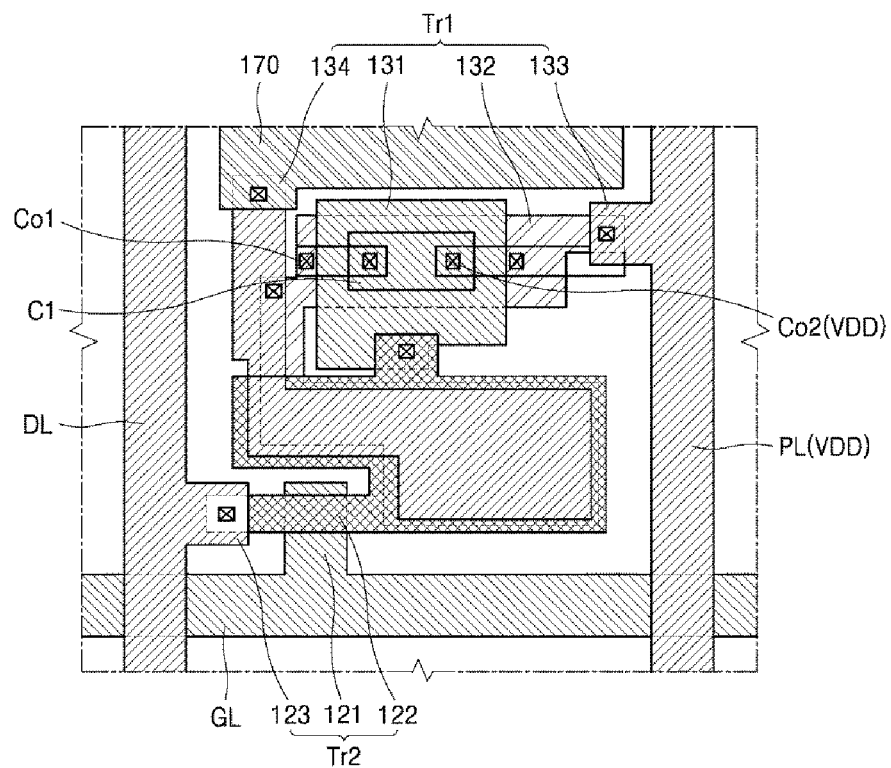
FIG. 4 is a plan view specifically showing a structure of the OLED pixel shown in FIG. 3.
Figure 5:
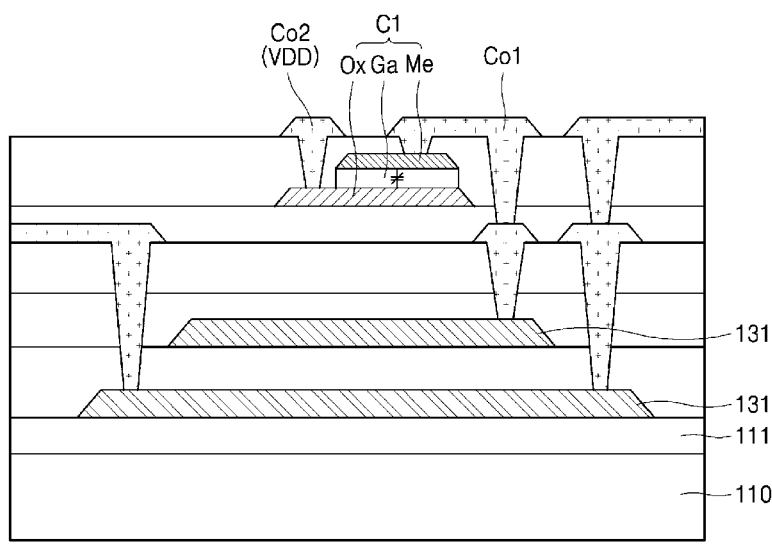
FIG. 5 is a cross-sectional view specifically showing a variable capacitor connected in parallel to a gate electrode of the driving thin film transistor (TFT) shown in FIG. 4.

FIG. 4 is a plan view specifically showing a structure of the OLED pixel shown in FIG. 3. FIG. 5 is a cross-sectional view specifically showing a variable capacitor connected in parallel to the gate electrode of the driving TFT shown in FIG. 4.

Referring to FIGS. 4 and 5, a buffer layer 111 may be deposited and formed on a substrate 110.

The buffer layer 111 may minimize permeation of moisture or oxygen through the substrate 110 and flatten an upper surface of the substrate 110. The buffer layer 111 may be made of an insulating material. The insulating material constituting the buffer layer 111 may be selected in accordance with a type of the substrate 110 or types of the switching TFT Tr2 and the driving TFT Tr1. However, the buffer layer 111 is not necessarily used for the OLED display device, and thus, may be omitted.

The switching TFT Tr2 and the driving TFT Tr1 may be formed in different areas of a front surface of the buffer layer 111. The switching TFT Tr2 may include a gate electrode 121, an active layer 122, and source and drain electrodes 123. The driving TFT Tr1 also may include a gate electrode 131, an active layer 132, a source electrode 134, and a drain electrode 133.

The switching TFT Tr2 may be an oxide semiconductor type TFT whose active layer is made of an oxide semiconductor. The switching TFT Tr2 may have a bottom gate structure in which the gate electrode, the active layer made of the oxide semiconductor, and the source and drain electrodes are sequentially stacked on a surface of the substrate.

On the other hand, the driving TFT Tr1 may be a low temperature poly-silicon (LTPS) type TFT in which the active layer is made of LTPS. The driving TFT Tr1 may have a bottom gate structure in which the gate electrode, the active layer made of LTPS, and the source and drain electrodes are sequentially stacked on a surface of the substrate.

In FIG. 5, the cross-sectional structure of the switching TFT Tr2 is omitted. In FIG. 4, it is shown that the active layer 122 of the switching TFT Tr2 is in direct contact with the gate electrode 131 of the driving TFT Tr1. When the source electrode of the switching TFT Tr2 is used, the source electrode of the switching TFT Tr2 may be formed of the same material and on the same layer as the drain electrode 123 of the switching TFT Tr2, and the source electrode of the driving TFT Tr1 may be electrically connected to the gate electrode 131 of the driving TFT Tr1 at an arbitrary position.

As shown in FIG. 5, the driving TFT Tr1 may have a coplanar structure. In this case, the driving TFT Tr1 may have a structure in which the active layer 132, the gate electrode 131 and the source and drain electrodes are stacked on the substrate 110. For example, the active layer 132 may be formed by patterning LTPS on the buffer layer 111, and the gate electrode 131 may be patterned to overlap the active layer 132 by a predetermined area with an insulating layer or a protective film positioned therebetween.

Thereafter, the variable storage capacitor C1 may be formed to structurally overlap the driving TFT Tr1. At this time, the variable storage capacitor C1 may include an oxide semiconductor layer Ox, a gate insulating film Ga, and a conductive electrode layer Me sequentially stacked on the substrate 110 that overlaps the driving TFT Tr1.

The oxide semiconductor layer Ox may be formed by selectively conductivizing a contact area of a second contact electrode Co2 electrically connected to the high potential voltage supply terminal VDD. Also, the oxide semiconductor layer Ox may be formed by conductivizing an entire area including a deposition area of the gate insulating film Ga in addition to the contact area of the second contact electrode Co2.

The variable storage capacitor C1 may be formed in parallel with the driving TFT Tr1 and between the gate terminal of the driving TFT Tr1 and the high potential voltage supply terminal VDD. The conductive electrode layer Me of the variable storage capacitor C1 may be electrically connected to the gate electrode 131 of the driving TFT Tr1 through a first contact electrode Co1, and the oxide semiconductor layer Ox of the variable storage capacitor C1 may be electrically connected to the high potential voltage supply terminal VDD through the second contact electrode Co2.

As described above, the variable storage capacitor C1 may be configured so that the capacitance thereof varies in accordance with a voltage difference between the gate electrode 131 of the driving TFT Tr1 and the high potential voltage supply terminal VDD. Thus, the capacitance of the variable storage capacitor C1 may gradually increase during a period in which a data voltage is input to the gate electrode 131 of the driving TFT Tr1 through the switching TFT Tr2. The capacitance of the variable storage capacitor C1 may gradually decrease in a period in which the driving TFT Tr1 is turned on by a data voltage supplied from the switching TFT Tr2 and a storage voltage of the storage capacitor C1, and the OLED maintains light emission and a light emission state.

As a result, in each OLED pixel P, a charging speed and a charging rate of the data voltage may be increased through the variable storage capacitor C1, thereby improving the threshold voltage compensation efficiency of the driving TFT Tr1.

Figure 6:
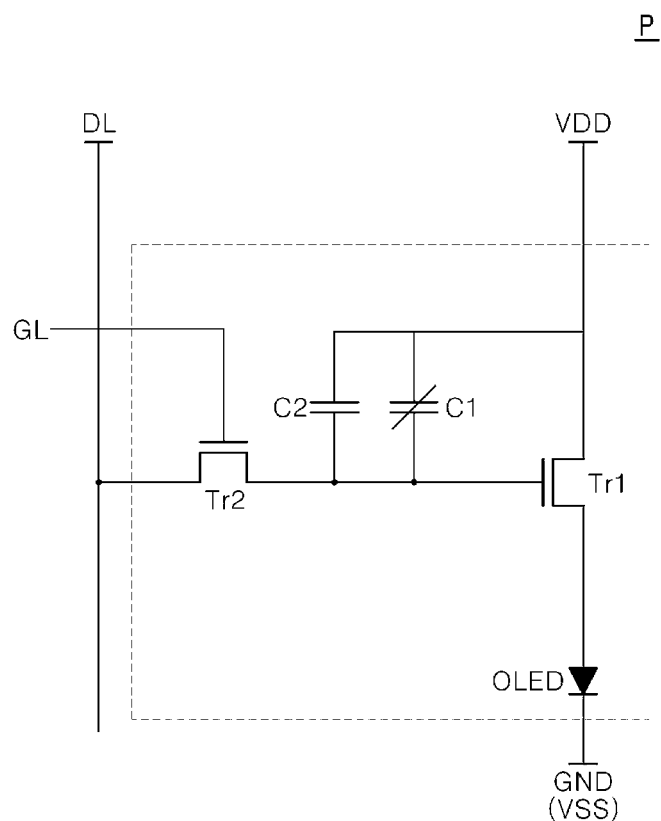
FIG. 6 is another circuit diagram showing the OLED pixel shown in FIGS. 1 and 2.

FIG. 6 is another circuit diagram of the OLED pixel shown in FIGS. 1 and 2.

Referring to FIG. 6, each of the OLED pixels P according to aspects of the present disclosure may include an OLED, a driving TFT Tr1, a switching TFT Tr2, a fixed (or non-variable) capacitor C2, and a variable storage capacitor C1.

The fixed capacitor C2 may be formed in parallel with the variable storage capacitor C1 and between the gate terminal of the driving TFT Tr1 and the high potential voltage supply terminal VDD. Further, the fixed capacitor C2 may be formed in parallel with the driving TFT Tr1.

The fixed capacitor C2 may charge a data voltage input through the switching TFT Tr2 with a smaller capacitance than the variable storage capacitor C1, and be discharged during a period in which the TFT Tr1 is turned on and the OLED maintains light emission and a light emission state.

Thus, the fixed capacitor C2 may increase a charging speed of the data voltage in an initial period in which the data voltage is input and sampled through the switching TFT Tr2. The fixed capacitor C2 may be formed between the gate terminal of the driving TFT Tr1 and the capacitor voltage input circuit, or between the gate terminal of the driving TFT Tr1 and the reference voltage input terminal.

The fixed capacitor C2 may include the gate electrode 131 of the driving TFT and a conductive electrode layer Ce1 that overlaps at least a partial area of the gate electrode 131 of the driving TFT with the insulating layer positioned therebetween. That is, the fixed capacitor C2 may be configured so that at least a partial area thereof overlaps the driving TFT Tr1.

The fixed capacitor C2 may utilize a part of the gate electrode 131 of the driving TFT Tr1 as a lower electrode. The conductive electrode layer Ce1 may be additionally formed with the gate insulating film that serves as the insulating layer positioned between the gate electrode 131 of the driving TFT Tr1 and the conductive electrode layer Ce1. The conductive electrode layer Ce1 may be electrically connected to the high potential voltage supply terminal VDD, capacitor voltage input circuit, or reference voltage input terminal through a third contact electrode.

The variable storage capacitor C1 may be formed between the gate terminal of the driving TFT Tr1 and the high potential voltage supply terminal VDD, and thus the capacitance there of may vary in accordance with a voltage difference between the gate terminal of the driving TFT Tr1 and the high potential voltage supply terminal VDD.

The variable storage capacitor C1 may be formed in parallel with the fixed capacitor C2 and the driving TFT Tr1. The variable storage capacitor C1 also may be formed between the gate terminal of the driving TFT Tr1 and the capacitor voltage input circuit or between the gate terminal of the driving TFT Tr1 and the reference voltage input terminal.

The variable storage capacitor C1 may include the oxide semiconductor layer Ox, the gate insulating film Ga, and the conductive electrode layer Me sequentially stacked on the substrate, and thus the capacitance thereof may vary in accordance with a voltage difference between the oxide semiconductor layer Ox and the conductive electrode layer Me. The variable storage capacitor C1 may be formed in parallel with the driving TFT Tr1 and between the gate terminal of the driving TFT Tr1 and the high potential voltage supply terminal VDD. The conductive electrode layer Me of the variable storage capacitor C1 may be electrically connected to the gate terminal of the driving TFT Tr1, and the oxide semiconductor layer Ox of the variable storage capacitor C1 may be electrically connected to the high potential voltage supply terminal VDD.

The capacitance of the variable storage capacitor C1 may gradually increase during a period in which the data voltage is input and sampled through the switching TFT Tr2, and input to the gate terminal of the driving TFT Tr1, and may gradually decrease during a period in which the TFT Tr1 is turned on and the OLED maintains light emission and a light emission state.

The variable storage capacitor C1 and the fixed capacitor C2 may be formed in parallel in the gate terminal of the driving TFT Tr1, and auxiliary capacitors may be further formed. Specifically, a parasitic capacitor may be formed between the gate terminal of the driving TFT Tr1 and the input terminal of the OLED, and an additional parasitic capacitor may be further formed between the gate terminal of the driving TFT Tr1 and the drain terminal to which the high potential voltage VDD is input.

Figure 7:
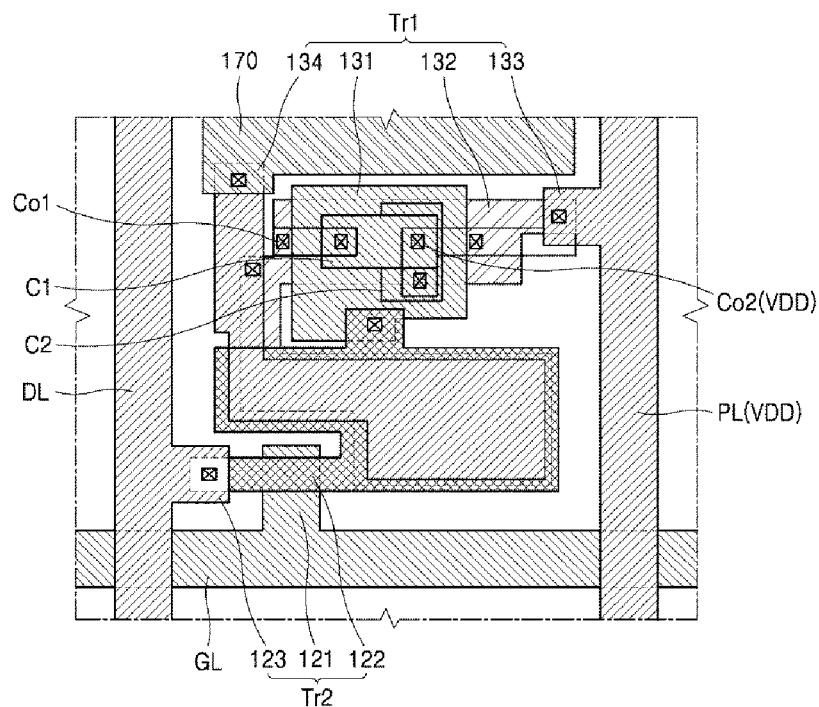
FIG. 7 is a plan view specifically showing a structure of the OLED pixel shown in FIG. 6.
Figure 8:
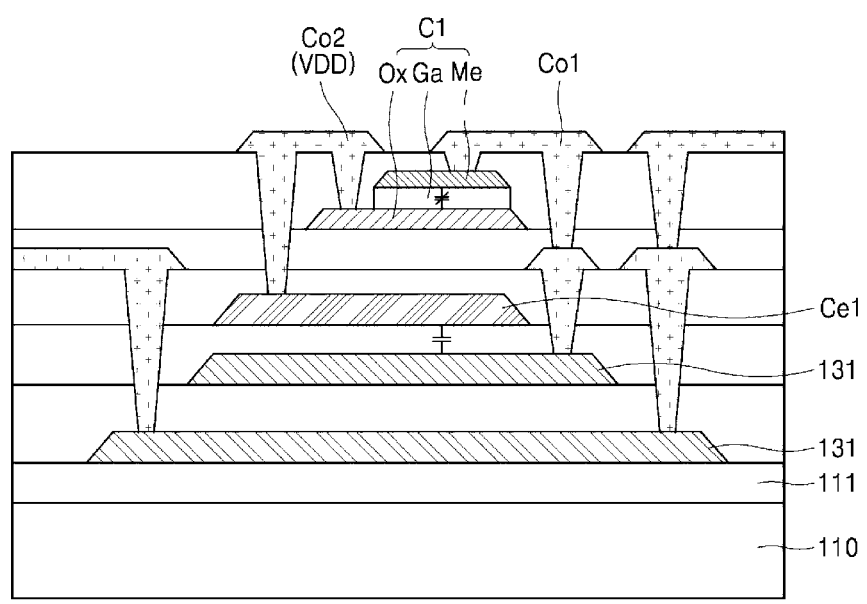
FIG. 8 is a cross-sectional view specifically showing a fixed and variable capacitor connected in parallel to a gate electrode of the driving TFT shown in FIG. 7.

FIG. 7 is a plan view specifically showing a structure of the OLED pixel shown in FIG. 6. FIG. 8 is a cross-sectional view specifically showing a fixed and variable capacitor connected in parallel to a gate electrode of the driving TFT shown in FIG. 7.

Referring to FIGS. 7 and 8, the buffer layer 111 may be deposited and formed on the substrate 110.

The switching TFT Tr2 and the driving TFT Tr1 may be formed in different areas of the front surface of the buffer layer 111. The switching TFT Tr2 may include the gate electrode 121, the active layer 122, and the source and drain electrodes 123. The driving TFT Tr1 also may include the gate electrode 131, the active layer 132, the source electrode 134, and the drain electrode 133.

The switching TFT Tr2 may be an oxide semiconductor type TFT whose active layer is made of an oxide semiconductor. The switching TFT Tr2 may have a bottom gate structure in which the gate electrode, the active layer made of the oxide semiconductor, and the source and drain electrodes are sequentially stacked on a surface of the substrate.

On the other hand, the driving TFT Tr1 may be a LTPS type TFT in which the active layer is made of LTPS. The driving TFT Tr1 may have a bottom gate structure in which the gate electrode, the active layer made of LTPS, and the source and drain electrodes are sequentially stacked on a surface of the substrate.

As shown in FIG. 8, the driving TFT Tr1 may have a structure in which the active layer 132, the gate electrode 131 and the source electrode are stacked on the substrate 110. For example, the active layer 132 may be formed by patterning LTPS on the buffer layer 111, and the gate electrode 131 may be patterned to overlap the active layer 132 by a predetermined area with the insulating layer or the protective film positioned therebetween.

Thereafter, the fixed capacitor C2 may be formed by patterning an upper electrode Ce1 so that a predetermined area of the upper electrode Ce1 overlaps the gate electrode 131 of the driving TFT Tr1 with the insulating layer positioned therebetween.

The upper electrode Ce1 of the fixed capacitor C2 may be electrically connected to the high potential voltage supply terminal VDD, capacitor voltage input circuit or reference voltage input terminal through the third contact electrode. Thus, the fixed capacitor C2 may be configured so that that at least a partial area thereof overlaps the active layer 132 and the gate electrode 131 of the driving TFT Tr1.

Thereafter, the variable storage capacitor C1 may be configured so that that at least a partial area thereof overlaps the active layer 132 and the gate electrode 131 of the driving TFT Tr1. As shown in FIG. 8, the variable storage capacitor C1 may include the oxide semiconductor layer Ox, the gate insulating film Ga, and the conductive electrode layer Me sequentially stacked on the substrate 110 that overlaps the driving TFT Tr1. As described above, the oxide semiconductor layer Ox may be formed by selectively conductivizing the contact area of the second contact electrode Co2 electrically connected to the high potential voltage supply terminal VDD. Also, the oxide semiconductor layer Ox may be formed by conductivizing the entire area including the deposition area of the gate insulating film Ga in addition to the contact area of the second contact electrode Co2.

The variable storage capacitor C1 may be formed in parallel with the driving TFT Tr1 and between the gate terminal of the driving TFT Tr1 and the high potential voltage supply terminal VDD. The conductive electrode layer Me of the variable storage capacitor C1 may be electrically connected to the gate electrode 131 of the driving TFT Tr1 through the first contact electrode Co1, and the oxide semiconductor layer Ox of the variable storage capacitor C1 may be electrically connected to the high potential voltage supply terminal VDD through the second contact electrode Co2.

As described above, the fixed capacitor C2 may charge a data voltage input through the switching TFT Tr2 with a smaller capacitance than the variable storage capacitor C1 to increase the charging speed of the data voltage in the initial period in which the data voltage is input and sampled through the switching TFT Tr2. The variable storage capacitor C1 may secure a sufficient storage capacitance as the charging progresses, thereby increasing the charging speed and the charging rate of the data voltage of each of the OLED pixels P.

As described above, the OLED display device according to aspects of the present disclosure having various technical features as described above may improve the threshold voltage compensation efficiency and solve the problem such as non-uniform luminance and an afterimage by increasing the charging speed and the charging rate of the data voltage of the OLED pixel P.

Further, the OLED display device according to aspects of the present disclosure may be advantageous for high-speed driving by allowing the storage capacitor C1 having a capacitance varying in accordance with a magnitude of the data voltage to be formed in the gate electrode terminal of the driving TFT in order to increase the sampling speed and the charging rate of the data voltage of the OLED pixel.

The present disclosure described as above is not limited by the aspects described herein and accompanying drawings. It should be apparent to those skilled in the art that various substitutions, changes and modifications which are not exemplified herein but are still within the spirit and scope of the present disclosure may be made. Therefore, the scope of the present disclosure is defined not by the detailed description, but by the claims and their equivalents, and all variations within the scope of the claims and their equivalents are to be construed as being included in the present disclosure.

What is claimed is:

1. An organic light emitting diode display device, comprising:
    a display panel including a plurality of pixels arranged in a matrix form and displaying an image;
    a switching thin film transistor (TFT) disposed in the plurality of pixels and configures to switch a data voltage pass supplied from a data line in response to a scan signal input through a gate line;
    a driving TFT disposed in the plurality of pixels, turned on in accordance with a magnitude of the data voltage supplied from the switching TFT and configured to control an amount of light emitted from an organic light emitting diode (OLED); and
    a variable storage capacitor connected in parallel with a gate electrode of the driving TFT and having a capacitance varying in accordance with a magnitude of a voltage applied to a gate electrode of the driving TFT,
    wherein the variable storage capacitor includes an oxide semiconductor layer, a gate insulating film, and a conductive electrode layer sequentially stacked on a substrate of the organic light emitting diode display device,
    wherein the conductive electrode layer is electrically connected to the gate terminal of the driving TFT, and the oxide semiconductor layer is electrically connected to the high potential or low potential voltage supply terminal.

2. The organic light emitting diode display device according to claim 1, wherein the variable storage capacitor has a storage capacitance varies in real time in response to a voltage difference between the gate terminal of the driving TFT and the high potential or low potential voltage supply terminal.

3. The organic light emitting diode display device according to claim nil, wherein the driving TFT includes a low temperature polysilicon (LTPS) type TFT in which an active layer is made of LTPS and is formed as a coplanar structure.

4. The organic light emitting diode display device according to claim 3, wherein the variable storage capacitor includes an oxide semiconductor layer, a gate insulating layer and a conductive electrode layer sequentially stacked, and overlaps the driving TFT.

5. The organic light emitting diode display device according to claim 1, wherein the variable storage capacitor is disposed between a gate terminal of the driving TFT and a capacitor voltage input circuit.

6. The organic light emitting diode display device according to claim 5, wherein the variable storage capacitor has a storage capacitance varies in real time in response to a voltage difference between the gate terminal of the driving TFT and the capacitor voltage input circuit.

7. The organic light emitting diode display device according to claim 5, wherein the variable storage capacitor has a storage capacitance varies in real time in response to a voltage difference between the gate terminal of the driving TFT and the reference voltage input terminal.

8. The organic light emitting diode display device according to claim 1, wherein the variable storage capacitor is disposed between a gate terminal of the driving TFT and a reference voltage input terminal.

9. An organic light emitting diode display device, comprising:
a display panel including a plurality of pixels arranged in a matrix form and displaying an image;
a switching TFT disposed in the plurality of pixels and configured to switch a data voltage pass supplied from a data line in response to a scan signal input through a gate line;
a driving TFT disposed in the plurality of pixels, turned on in accordance with a magnitude of a data voltage supplied from the switching TFT and configured to control an amount of light emitted from an organic light emitting diode;
a variable storage capacitor connected in parallel to a gate electrode of the driving TFT and having a variable capacitance varying in accordance with a magnitude of a voltage applied to the gate electrode of the driving TFT; and,
a non-variable capacitor having a non-variable capacitance smaller than that of the variable storage capacitor and connected in parallel with the variable storage capacitor,
wherein the non-variable capacitor includes the gate electrode of the driving TFT and a conductive electrode layer that overlaps at least a portion of the gate electrode of the driving TFT with a gate insulating film positioned therebetween, and
wherein the conductive electrode layer is electrically connected to the high potential or low potential voltage supply terminal.

10. The organic light emitting diode display device according to claim 9, wherein the driving TFT includes an LTPS type TFT in which an active layer is made of LTPS and is formed as a coplanar structure.

11. The organic light emitting diode display device according to claim 9, wherein the variable storage capacitor includes the gate electrode of the driving TFT and a conductive electrode layer that overlaps at least a portion of the gate electrode of the driving TFT with a gate insulating film positioned therebetween, and overlaps the driving TFT.

12. The organic light emitting diode display device according to claim 9, wherein the conductive electrode layer of the non-variable storage capacitor is electrically connected to a capacitor voltage input circuit or a reference voltage input terminal.

13. The organic light emitting diode display device according to claim 9, wherein the non-variable storage capacitor is disposed between a gate terminal of the driving TFT and a capacitor voltage input circuit with a non-variable storage capacitance.

14. The organic light emitting diode display device according to claim 9, wherein the non-variable storage capacitor is disposed between a gate terminal of the driving TFT and a reference voltage input terminal with a non-variable storage capacitance.

15. The organic light emitting diode display device according to claim 9, wherein the variable storage capacitor is disposed between a gate terminal of the driving TFT and a high potential or low potential voltage supply terminal and has a variable storage capacitance varies in real time in response to a voltage difference between the gate terminal of the driving TFT and the high potential or low potential voltage supply terminal.

16. The organic light emitting diode display device according to claim 9, wherein the variable storage capacitor is formed between a gate terminal of the driving TFT and a capacitor voltage input circuit so that a storage capacitance varies in real time in response to a voltage difference between the gate terminal of the driving TFT and the capacitor voltage input circuit, or the variable storage capacitor is formed between a gate terminal of the driving TFT and a reference voltage input terminal.

17. The organic light emitting diode display device according to claim 16, wherein the variable storage capacitor a variable storage capacitance varies in real time in response to a voltage difference between the gate terminal of the driving TFT and the reference voltage input terminal.

* * * * *